United States Patent

[11] 3,593,199

[72] Inventors John C. Spann
Baltimore;
James R. Hudson, Poplar Point, both of, Md.
[21] Appl No. 877,650
[22] Filed Nov. 18, 1969
[45] Patented July 13, 1971
[73] Assignee Westinghouse Electric Corporation
Pittsburgh, Pa.

[54] VOLTAGE VARIABLE CLOCK OSCILLATOR
10 Claims, 3 Drawing Figs.

[52] U.S. Cl. .......... 331/111, 307/213, 331/108 D
[51] Int. Cl. .......... H03k 3/282
[50] Field of Search .......... 331/111, 108 D; 307/213

*Primary Examiner*—John Kominski
*Attorneys* –F. H. Henson and E. P. Klipfel

ABSTRACT: A clock oscillator which can be used as a master clock in a digital system comprising an emitter coupled logic gate operated as a free running bistable device by means of a resistance-capacitance network coupled thereto and which is alternately charged and discharged at the desired output frequency and wherein the resistive element in the network is comprised of a metal oxide silicon field effect transistor (MOSFET) the drain-source resistance of which is selectively varied by means of a potential applied to the gate thereof from an externally controlled source for establishing a desired frequency of operation.

VOLTAGE VARIABLE CLOCK OSCILLATOR

CROSS-REFERENCE TO RELATED APPLICATION

The subject invention is related to U.S. Patent application Ser. No. 877,651 (Westinghouse Case No. 39,517), filed concurrently herewith on Nov. 11, 1969 in the name of James R. Hudson and John C. Spann, and entitled, "Variable Multiphase Clock System." This application is also assigned to the assignee of the present invention.

BACKGROUND OF THE INVENTION

1. Field of the Invention

This invention relates to monolithic integrated circuits comprising emitter coupled current mode logic circuits, and more particularly to a free-running multivibrator-type oscillator employing transistors operative in the nonsaturating mode wherein a typical emitter coupled logic voltage swing between the logic "0" state and the logic "1" state is in the order of 0.75 volts. Moreover, the present invention is directed to a free-running oscillator wherein the timing function is controlled by the charge and discharge rate of a resistance-capacitance circuit.

2. Description of the Prior Art

Monolithic emitter coupled current mode logic circuits of the type referred to as MECL is generally described in a publication entitled *The Integrated Circuit Data Book*, published by Motorola Semiconductor Products, Inc., 1968, at pages 10–3 through 10–5, inclusive. The MECL line of digital integrated circuits is treated therein with specific reference being made to the operation of the basic MECL gate. Furthermore, the same publication discloses another configuration of a current mode gate on pages 10—17, which is utilized by the circuit comprising the present invention.

Additionally, U.S. Pat. No. 3,452,219 issued to Peter S. Duryee discloses amplitude responsive universal control circuits including emitter coupled logic circuits including a differential amplifier receptive to input signals and emitter follower circuits coupled thereto for providing low impedance complementary outputs. Said patent is referenced as being further illustrative of the state of the art.

While the referenced prior art discloses integrated logic circuits which are adapted to be utilized as modular components and which comprise members of a family of monolithic integrated circuits adapted for a wide variety of applications, there exists a deficiency for a simple yet reliable voltage variable oscillator, utilizing integrated circuit modules, which is adapted to be controlled from a remote location.

SUMMARY

According to the present invention, a remotely controlled voltage variable frequency clock oscillator is provided which comprises an emitter coupled current mode logic gate circuit including a differential amplifier having a first and second input and a first and second output. A first emitter follower circuit is coupled by its input to the first output of said differential amplifier circuit while a second emitter follower circuit is coupled by its input to the second output of said differential amplifier, providing complementary outputs thereby. A series resistance-capacitance circuit is connected across the complementary outputs provided by the first and second emitter-follower circuit; however, the resistive element of the resistance-capacitance circuit combination comprises the drain-source resistance of a field effect transistor. Additional circuit means are provided which couples said first input of said differential amplifier to the common connection between said field effect transistor and said capacitor and said second input to said differential amplifier to the output of the emitter-follower common to the field effect transistor. A control voltage is coupled to the gate electrode of said field effect transistor from a remote source for selectively varying the drain-source resistance of the field effect transistor and thereby controlling the frequency of oscillation.

DESCRIPTION OF THE PREFERRED EMBODIMENT

Figures 1, 2:
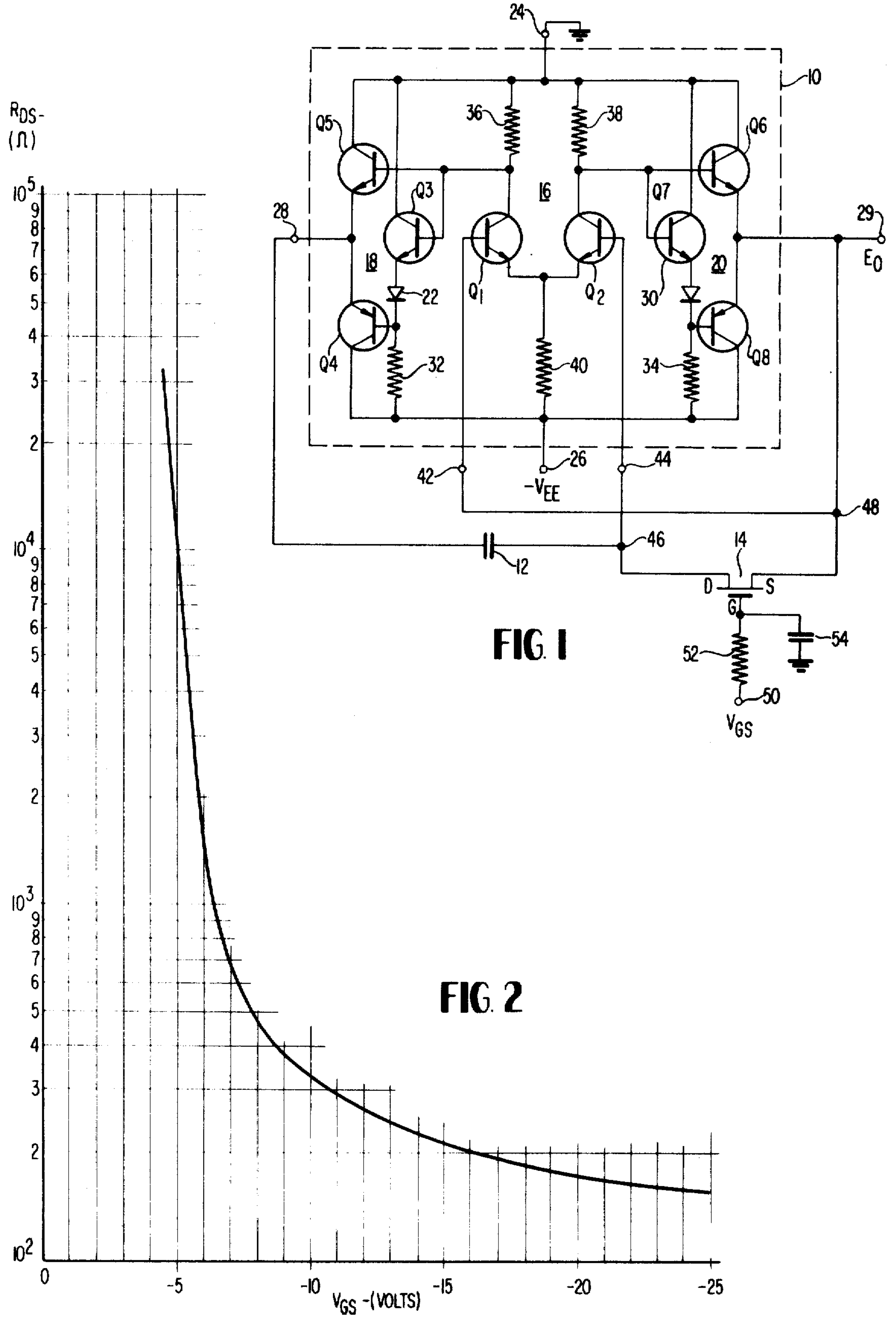
FIG. 1 is an electrical schematic diagram of the preferred embodiment of the subject invention.
FIG. 2 is a graphical illustration of the drain-source resistance vs. control voltage of the field effect transistor in the resistance-capacitance feedback.

Referring now to the drawings wherein FIG. 1 is a schematic diagram of the preferred embodiment of the subject invention, three basic components are disclosed, these being: an emitter coupled current mode logic gate 10, a fixed capacitor 12, and a metal oxide silicon field effect transistor (MOSFET) 14. The emitter coupled logic gate circuit 10 is comprised of a differential amplifier circuit 16 including transistors Q1 and Q2 and a first and second dual emitter follower circuit 18 and 20, respectively coupled to the collectors of transistors Q1 and Q2. The first emitter follower circuit 18 is comprised of Q3, Q4 and Q5 with transistors Q3 and Q5 having their bases commonly coupled to the collector of Q1 while the base of Q4 is coupled to the emitter of transistor Q3 through the diode 22. Transistors Q4 and Q5 are comprised of complementary transistors connected in cascode circuit relationship between a point of reference potential illustrated as ground connected to terminal 24 and a source of negative supply potential $-V_{EE}$ coupled to terminal 26. A first output terminal 28 is provided between the common connection between the emitters of transistors Q4 and Q5. In a like manner, the second dual emitter follower circuit 20 is comprised of transistors Q6, Q7 and Q8. The bases of transistors Q6 and Q7 are commonly connected to the collector transistor Q2. As before, transistors Q6 and Q8 are connected in cascode between terminals 24 and 26. A second diode 30 is connected from the emitter of transistor Q7 to the base of transistor Q8.

Completing the circuit 10 the transistor Q4 of the emitter follower circuit 18 includes a base bias resistor 32 and transistor Q8 of the emitter follower circuit 20 includes a base bias resistor 34. The first transistor Q1 of the differential amplifier 16 includes a collector load resistor 36, while the second transistor Q2 includes the collector load resistor 38. The emitters of transistors Q1 and Q2 are commonly coupled to the negative supply potential $-V_{EE}$ applied to terminal 26 through a single resistor 40. The differential amplifier 16 includes two inputs, the first being terminal 42 connected to the base of transistor Q1 and the second being terminal 44 connected to the base of transistor Q2. And finally a second output terminal 29 is provided at the common connection between the bases of transistors Q6 and Q8.

The emitter coupled logic gate 10 comprises an integrated circuit logic element produced and identified by the Motorola Semiconductor Products Corporation as an MC365 line driver and capacitance driver and which is illustrated at pages 10—17 of the referenced publication, *The Integrated Circuit Data Book*.

Under normal operation, all of the transistors Q1—Q8 operate in the nonsaturation mode and the output voltages appearing at terminals 28 and 29 are complements of each other. Additionally, one of the input terminals 42 or 44 of the differential amplifier 16 is connected to a fixed potential, which may be typically −1.15 volts while a supply potential $V_{EE}$ of −5.2 volts is applied to terminal 26. The voltage at the complementary output terminals 28, 29 then will exhibit voltage levels of −0.7 volts and −1.5 volts defining the digital logic level states of "1" and "0," respectively. These are often referred to as the "high" and "low" states of a logic circuit.

The subject invention contemplates the addition of a voltage controlled resistance-capacitance feedback network coupled between the output terminals 28 and 29, and which is alternately charged and discharged so that a variable voltage appears across the capacitor 12 which is applied to one input 44 of the differential amplifier as a varying reference voltage. In addition to the fixed capacitor 12 the resistor-capacitor feedback network includes the MOSFET 14 having its drain electrode coupled to the capacitor 12 at junction 46 while the source electrode is commonly connected to the output terminal 29 and the input terminal 42 of the differential amplifier 16 at the junction 48. While one side of the capacitor is connected to the input terminal 44 the other side is directly connected to the output terminal 28 of the emitter follower 18. The gate electrode of the MOSFET 14 is coupled to a control voltage $V_{GS}$ applied from a remote source, not shown, to the terminal 50. An RC noise filter comprising resistor 52 and capacitor 54 is additionally included for providing additional noise rejection; however, the extremely high input impedance of the MOSFET 14 allows the voltage $V_{GS}$ to be applied remotely without the noise filter when desirable.

By selectively varying the magnitude of the voltage $V_{GS}$ applied to terminal 50, the drain-source resistance of the MOSFET 14 which appears between junctions 46 and 48 ranges anywhere from 150 ohms at saturation to $1\times10^{10}$ ohms at cutoff (nonconductive condition) of the MOSFET 14. The capacitance 12 and the drain-source resistance of the MOSFET 14 accordingly act as a voltage variable resistance-capacitance feedback network coupled between the output terminals 28 and 29. With one input terminal 44 of differential amplifier 16 connected to the capacitor 12 at the junction 46 and the other input terminal 42 connected to the output terminal 29 through junction 48, a free-running digital clock oscillator is provided which exhibits a square wave output voltage $E_0$ at terminal 29 which varies between −1.5 volts (logic "0") and −0.7 volts (logic "1").

The operation of the circuit shown in FIG. 1 can best be described by explaining the operation in one complete cycle. Assume initially that the output terminal 29 is in its logic "1" state wherein a voltage of −0.7 volts exists thereat while the other output terminal 28 is in the logic "0" state or −1.5 volts. Since the base of transistor Q1 of the differential amplifier 16 is connected to output terminal 29 through the input terminal 42, transistor Q1 will be conducting the majority of the current through the differential amplifier 16. The capacitance-resistance combination of the capacitor 12 and the MOSFET 14 connected in series between terminals 28 and 29 will have a voltage difference of 0.75 volts which will charge the capacitor 12 in accordance with the RC time constant governed by its capacitance value and the drain-source resistance of the MOSFET 14 as determined by the voltage $V_{GS}$ applied to its gate. The voltage at junction 46 will rise towards the more positive potential (−0.7 volts) at terminal 29. This causes the voltage at the base of transistor Q2 to also increase because of its connection to junction 46, resulting in more current flow through transistor Q2 and less current flow through transistor Q1 until the base of transistor Q5 of the emitter-follower circuit 18 is sufficiently positive to turn transistor Q5 "on," at which time the output terminal 28 changes to −0.7 volts, thereby switching from a logic "0" to a logic "1". When the voltage at terminal 28 switches, the voltage at junction 46 rises more positively because the charge on the capacitor 12 cannot change instantaneously. This in turn causes the base of transistor Q6 to go more negative whereupon output terminal 29 switches to an output level of −1.5 volts, thereby going from a logic "1" to a logic "0". At this point, the voltage at junction 46 is −1.5 volts and the above process is initiated again, but in the opposite direction. Stated another way, the threshold voltage on the base of Q2 which causes the logic gate 10 to switch states is about −1.5 volts. The voltage at junction 46 will be approximately −1.8 volts under the initial conditions assumed above and moving in a more positive direction toward −0.7 volts. When the voltage at junction 46 gets to −1.15 volts, the outputs switch states and terminal 29 is now at −1.5 volts and terminal 28 is at −0.7 volts. When this transition occurs, the voltage at junction jumps in a step function by 0.7 volts and then discharges in a more negative direction toward −1.5 volts. When junction 46 has reached −1.15 volts the outputs again switch and junction 46 jumps negative by 0.7 volts.

Figure 3:
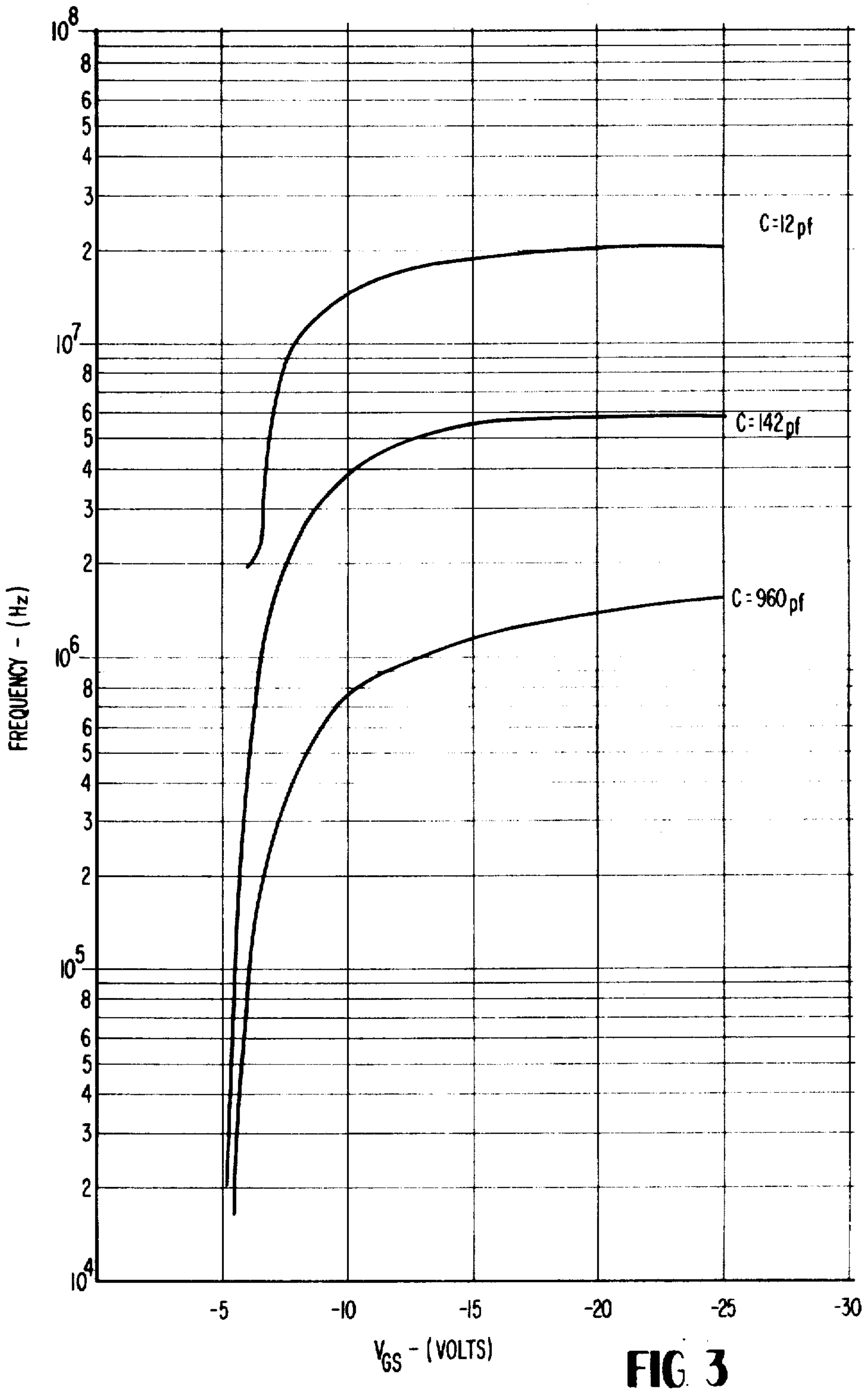
FIG. 3 is a graphical illustration of the frequency vs. control voltage characteristic of the subject invention for different values of capacitance in the resistance-capacitance feedback circuits.

The rate at which the voltage at junction 46 varies is a function of the drain-source resistance $R_{GS}$ and the value of the capacitor 12. For example, FIG. 2 is illustrative of the relationship of the drain-source resistance of a typical MEM511 MOSFET as a function of the control voltage $V_{GS}$ applied thereto. It can be seen that between the range of −5 volts and −25 volts the resistance varies between $1\times10^3$ ohms and 150 ohms. FIG. 3, on the other hand, is illustrative of the relationship of frequency of operation utilizing an MEM511 MOSFET with respect to the control voltage $V_{GS}$ for various fixed values of capacitance of the capacitor 12. For example, for a typical value of 960 pf. ($1\times10^{19}$ farads), the frequency output of the signal voltage $E_0$ appearing at terminal 29 will vary between $2.0\times10^4$ Hz. and $1.5\times10^4$ Hz. to $1.5\times10^6$ Hz. for a voltage between −6 and −25 volts. The curves further show that a nonlinear relationship exists between frequency and $V_{GS}$. For good stability, the curves in FIG. 3 illustrate that it is necessary to operate the gate of the MOSFET 14 at a potential in the range of −10 to −25 volts.

What has been shown and described therefore is a relatively simple means of obtaining the variable frequency clock oscillator useful in a digital system and which is easily fabricated. The applications of the MOSFET transistor in combination with the emitter coupled current mode logic gate are uniquely suitable due to the fact that the small voltage swing of the output between −0.7 volts and −1.5 volts is sufficiently small so that it has little, if any, effect on the drain-source resistance of the MOSFET 14 when coupled thereto. It is this feature that significantly provides the desirable free-running operation of the embodiment shown in FIG. 1.

While the subject invention has been disclosed and described with a certain degree of particularity, it should be observed that the detailed description has been by way of example only and is not meant to be interpreted in a limiting sense.

We claim as our Invention:

1. A voltage variable digital clock oscillator adapted to be varied in frequency by a control voltage from a control source, comprising, in combination;

a digital logic gate circuit having a first and a second input terminal and a first and a second output terminal, and being operable to provide mutually different output voltages at said output terminals indicative of either a logic "0" or a logic "1" state;

a field effect device having an input electrode and a pair of output electrodes;

a capacitance having one side thereof coupled to one of said pair of output electrodes and providing a first circuit junction thereat, and additionally including circuit means coupling the other side of said capacitance to said first output terminal and circuit means coupling the other of said pair of output electrodes to said second output terminal;

circuit means coupling said first circuit junction to said first input terminal;

circuit means coupling said second input terminal to said second output terminal; and circuit means applying said control voltage to said input electrode of said field effect device whereby said control voltage varies the resistance characteristic appearing between said pair of output electrodes to provide a resistance-capacitance feedback network to control the frequency of operation.

2. The invention as defined by claim 1 wherein said digital logic gate circuit comprises an emitter coupled current mode logic gate circuit and wherein the magnitude of the voltage difference between a logic "0" or "1" state is in the order of 1 volt or less.

3. The invention as defined by claim 1 wherein said field effect device comprises a field effect transistor and wherein said input electrode comprises the gate and said pair of output electrodes comprises the source and drain, respectively.

4. The invention as defined by claim 3 wherein said circuit means applying the control voltage includes filter circuit means coupled to said gate.

5. The invention as defined by claim 4 wherein said filter circuit means comprises a resistance coupled in series between said gate and said control source and a capacitor coupled from said gate to a point of reference potential.

6. The invention as defined by claim 3 wherein said field effect transistor comprises a metal oxide silicon field effect transistor.

7. The invention as defined by claim 1 wherein said capacitance comprises a fixed capacitor.

8. The invention as defined by claim 2 wherein said emitter coupled current mode gate circuit comprises a transistor differential amplifier including said first and said second input terminals and providing a pair of outputs, and a first and a second emitter follower circuit respectively coupled to said pair of outputs of said differential amplifier and respectively including said first and said second output terminal.

9. The invention as defined by claim 8 wherein said differential amplifier and said first and second emitter follower circuit comprise a unitary integrated circuit.

10. The invention as defined by claim 8 wherein said differential amplifier circuit and said first and second emitter follower circuits include transistors which operate in a nonsaturating mode of operation.